United States Patent
Chen et al.

(10) Patent No.: US 8,853,066 B2
(45) Date of Patent: Oct. 7, 2014

(54) METHOD FOR MANUFACTURING PIXEL STRUCTURE

(71) Applicant: Hannstar Display Corporation, New Taipei (TW)

(72) Inventors: Po-Hsiao Chen, Yunlin County (TW); Chien-Hao Wu, Tainan (TW); Rong-Bing Wu, Kaohsiung (TW); Chang-Ming Chao, Taichung (TW)

(73) Assignee: Hannstar Display Corporation, New Taipei (TW)

( * ) Notice: Subject to any disclaimer, the term of this patent is extended or adjusted under 35 U.S.C. 154(b) by 0 days.

(21) Appl. No.: 13/756,549

(22) Filed: Feb. 1, 2013

(65) Prior Publication Data

US 2014/0127891 A1    May 8, 2014

(30) Foreign Application Priority Data

Nov. 8, 2012 (CN) .......................... 2012 1 0443855

(51) Int. Cl.
  *H01L 21/28* (2006.01)
  *H01L 27/12* (2006.01)

(52) U.S. Cl.
  CPC ....... *H01L 21/28008* (2013.01); *H01L 27/1225* (2013.01)
  USPC ............................................... 438/586

(58) Field of Classification Search
  CPC ................. H01L 29/41733; H01L 27/1225; H01L 27/1214
  See application file for complete search history.

(56) References Cited

U.S. PATENT DOCUMENTS

| | | | |
|---|---|---|---|
| 5,610,082 A | * | 3/1997 | Oh ................................ 438/160 |
| 2002/0074549 A1 | * | 6/2002 | Park et al. ........................ 257/59 |
| 2009/0250695 A1 | * | 10/2009 | Tanaka et al. .................... 257/43 |
| 2010/0035378 A1 | * | 2/2010 | Chang ........................... 438/104 |
| 2010/0207118 A1 | | 8/2010 | Sakata et al. |
| 2011/0278565 A1 | | 11/2011 | Yim et al. |

FOREIGN PATENT DOCUMENTS

| | | |
|---|---|---|
| TW | 512247 | 12/2002 |
| TW | I237395 | 8/2005 |
| TW | I302033 | 10/2008 |
| TW | I313065 | 8/2009 |
| TW | I355746 | 1/2012 |

* cited by examiner

*Primary Examiner* — Charles Garber
*Assistant Examiner* — Alia Sabur
(74) *Attorney, Agent, or Firm* — Jianq Chyun IP Office

(57) ABSTRACT

A method for manufacturing pixel structure is provided. A patterned conductor layer including a gate, a scan line and a conductor pattern is formed on a substrate. A gate insulating layer, a metal oxide material layer and an etching stop material layer are formed on the substrate. Using the patterned conductor layer as mask, a patterned photoresist layer is formed on the etching stop material layer through a back exposure process. Using the patterned photoresist layer as mask, a metal oxide channel layer and an etching stop layer are formed above the gate. A source and a drain are formed on the etching stop layer. A passivation layer is formed on the substrate. A halftone mask is used to form a photosensitive layer on the passivation layer. The metal oxide material layer and the etching stop material layer on the scan line and the conductor pattern are removed.

9 Claims, 18 Drawing Sheets

METHOD FOR MANUFACTURING PIXEL STRUCTURE

CROSS-REFERENCE TO RELATED APPLICATION

This application claims the priority benefit of China application serial no. 201210443855.2, filed on Nov. 8, 2012. The entirety of the above-mentioned patent application is hereby incorporated by reference herein and made a part of this specification.

BACKGROUND

1. Technical Field

The invention relates to a method for manufacturing a pixel structure. Particularly, the invention relates to a method for manufacturing a pixel structure capable of reducing a number of masks.

2. Related Art

Liquid crystal displays (LCDs) have advantages of high image quality, small size, light weight, low driving power, low power consumption and wide application range, etc., which have replaced a cathode ray tube to become a mainstream of new generation displays. A conventional liquid crystal panel is composed of a color filter substrate, a thin film transistor array substrate and a liquid crystal layer disposed between the above two substrates. In order to improve display quality of the liquid crystal panel, many layout designs of a pixel structure in the display panel have been provided.

Generally, the thin film transistors are divided into amorphous silicon transistors and low temperature polycrystalline transistors according to channel layer materials thereof. However, to cop with increasing demands for the LCDs in the market, more efforts are put on research and development of new thin film transistor techniques. Among them, a thin film transistor using metal oxide as a channel layer has been developed, where an electrical characteristic thereof has caught up with the low temperature polycrystalline transistor, and the thin film transistor has a better effect in device performance.

Since the metal oxide is liable to be damaged by substances such as plasma, an etching liquid and a photoresist stripping liquid, etc. to change a thin film property of the channel layer. Thus, a thin film transistor pixel structure using the metal oxide such as indium gallium zinc oxide as the channel layer generally includes an etching stop layer disposed on the channel layer, six photomask processes are required in a manufacturing process. The six photomask processes include a first photomask process of forming a scan line and a gate, a second photomask process of forming a channel layer, a third photomask process of forming the etching stop layer, a fourth photomask process of forming a data line, a source and a drain, a fifth photomask process of forming a contact opening above the drain, and a sixth photomask process of forming a pixel electrode. However, the sixth photomask processes lead to high cost of the thin film transistor pixel structure, so that it is required to decrease the number of the photomasks required in a manufacturing process of the thin film transistor.

SUMMARY

The invention is directed to a method for manufacturing a pixel structure capable of reducing a number of required masks.

The invention provides a method for manufacturing a pixel structure. In the method, a first patterned conductor layer is formed on a substrate, where the first patterned conductor layer includes a gate, a scan line connected to the gate and a first conductor pattern. A gate insulating layer is formed on the substrate to cover the first patterned conductor layer. A metal oxide material layer and an etching stop material layer are sequentially formed on the gate insulating layer. A photoresist layer is formed on the etching stop material layer, and the first patterned conductor layer is used as a photomask, and a patterned photoresist layer is formed through a back exposure process, and the patterned photoresist layer is used as a mask to remove a part of the metal oxide material layer and a part of the etching stop material layer, so as to form a metal oxide channel layer and an etching stop layer above the gate, and form a metal oxide pattern and an etching stop pattern above the scan line and the first conductor pattern. A second patterned conductor layer is formed on the substrate, where the second patterned conductor layer includes a source, a drain and a data line connected to the source, and the source and the drain are located at two sides on the etching stop layer located above the gate. A passivation layer is formed on the substrate to cover the second patterned conductor layer. A halftone mask is used to form a photosensitive layer having a first opening on the passivation layer, where a thickness of the photosensitive layer located above the gate is greater than a thickness of the photosensitive layer located above the drain and the scan line, and the first opening exposes the passivation layer located above the first conductor pattern. The photosensitive layer is used as a mask to remove a part of the passivation layer, the etching stop pattern and the metal oxide pattern to form a first contact opening, a second contact opening and a third contact opening in the passivation layer, where the first contact opening exposes the first conductor pattern, the second contact opening exposes the drain, and the third contact opening exposes the gate insulating layer on the scan line. The photosensitive layer is removed. A patterned transparent conductive layer is formed on the passivation layer, the patterned transparent conductive layer includes a pixel electrode, and the pixel electrode is electrically connected to the drain through the second contact opening.

In an embodiment of the invention, the step of removing a part of the passivation layer, the etching stop pattern and the metal oxide pattern includes following steps. The photosensitive layer having the first opening is used as a mask to remove a part of the passivation layer, a part of the etching stop pattern and a part of the metal oxide pattern above the first conductor pattern to form the first contact opening exposing the first conductor pattern in the passivation layer. The photosensitive layer with a thinner thickness on the drain and the scan line is removed to form a second opening and a third opening in the photosensitive layer, and the remained photosensitive layer is located above the gate, where the second opening and the third opening respectively expose the passivation layer above the drain and the scan line. The photosensitive layer having the second opening and the third opening is used as a mask to remove a part of the passivation layer, the remained etching stop pattern and the remained metal oxide pattern to form the second contact opening and the third contact opening in the passivation layer.

In an embodiment of the invention, the step of removing a part of the passivation layer through the second opening and the third opening includes following steps. First, the passivation layer and the remained etching stop pattern are removed through the second opening and the third opening by a first etching process. Then, the remained metal oxide pattern is removed through the third opening by a second etching process.

In an embodiment of the invention, the patterned transparent conductive layer further includes a transparent conductive pattern, and the transparent conductive pattern is electrically connected to the first conductive pattern through the first contact opening.

In an embodiment of the invention, a material of the metal oxide material layer includes indium gallium zinc oxide.

In an embodiment of the invention, a material of the etching stop material layer includes silicon oxide or silicon nitride.

In an embodiment of the invention, a material of the etching stop material layer is the same to a material of the passivation layer.

In an embodiment of the invention, a method for removing a part of the etching stop material layer includes a dry etching process.

In an embodiment of the invention, a method for removing a part of the metal oxide material layer includes a wet etching process.

According to the above descriptions, in the method for manufacturing the pixel structure, the first patterned conductor layer is used as the mask when performing the back exposure on the photoresist layer, so as to form a metal oxide channel layer and an etching stop layer on the gate through the photoresist layer. Then, a halftone mask is used to manufacture the photoresist layer used for defining the passivation layer, so as to remove the metal oxide pattern and the etching stop pattern other than that above the gate. In this way, the masks used for defining the metal oxide channel layer and the etching stop layer can be saved, by which productivity of the pixel structures is enhanced, and a characteristic of the pixel structure that uses the metal oxide as the channel layer is improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A-1I are top views of a process of a method for manufacturing a pixel structure according to an embodiment of the invention.

FIGS. 2A-2I are cross-sectional views of FIGS. 1A-1I along lines I-I', II-II' and III-III'.

DETAILED DESCRIPTION OF DISCLOSED EMBODIMENTS

Figure 1A:
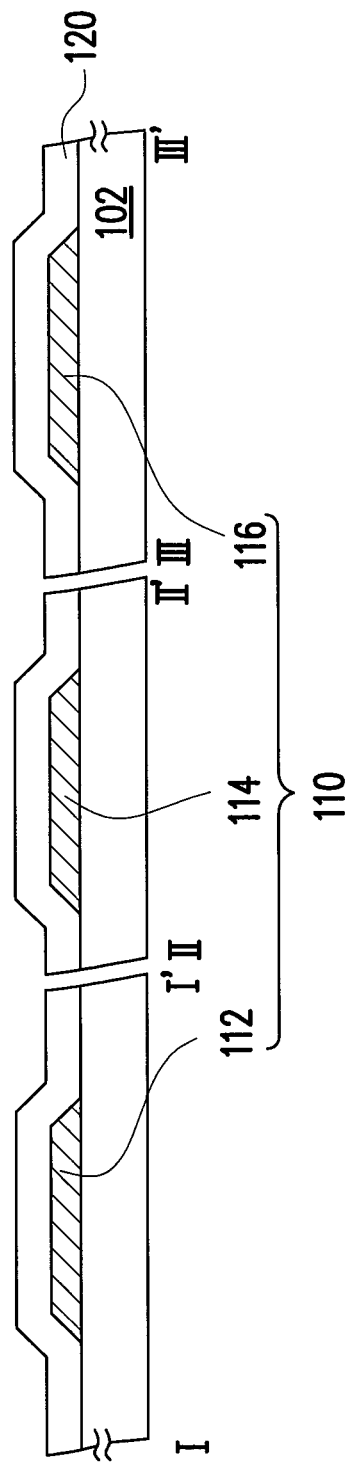

FIGS. 1A-1I are top views of a process for manufacturing a pixel structure according to an embodiment of the invention. FIGS. 2A-2I are cross-sectional views of FIGS. 1A-1I along lines I-I', II-II' and III-III'. For clarity's sake, a gate insulating layer, a photosensitive layer and a passivation layer are not illustrated in FIGS. 2A-2I. Referring to FIG. 1A and FIG. 2A, first, a first patterned conductor layer 110 is formed on a substrate 102, where the first patterned conductor layer 110 includes a gate 112, a scan line 114 connected to the gate 112 and a first conductor pattern 116. In the present embodiment, the substrate 102 is, for example, includes an active region and a peripheral region (not shown), where the gate 112 and the scan line 114 are disposed in the active region, and the first conductor pattern 116 is disposed in the peripheral region. The first conductor pattern 116 is, for example, electrically connected to the scan line 114, and the first conductor pattern 116 is, for example, a bonding pad. In the present embodiment, a material of the first patterned conductor layer 110 can be at least one selected from a group consisting of Cu, Mo, Ti, Al, W, Ag, Au and alloys thereof, and a formation method thereof includes a thin film deposition process, a photolithography process, and an etching process, etc. In other words, the first patterned conductor layer 110 can be formed through a first mask.

Figure 1B:
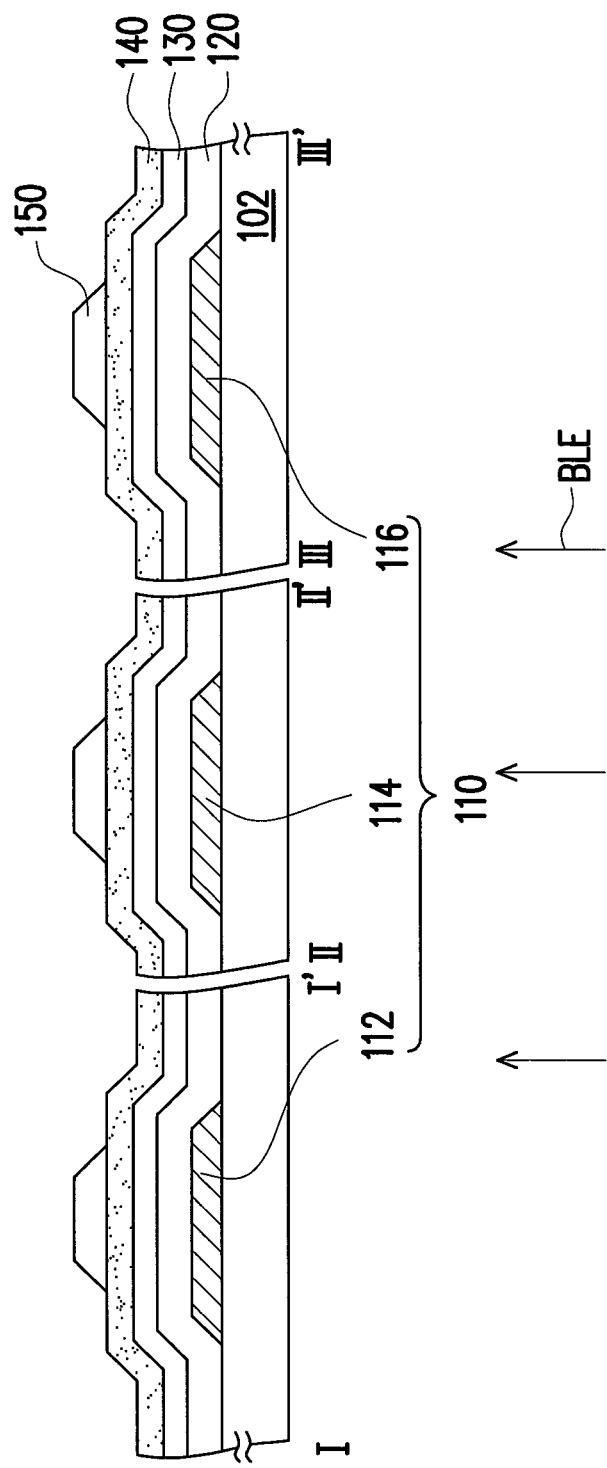
Figure 2A:
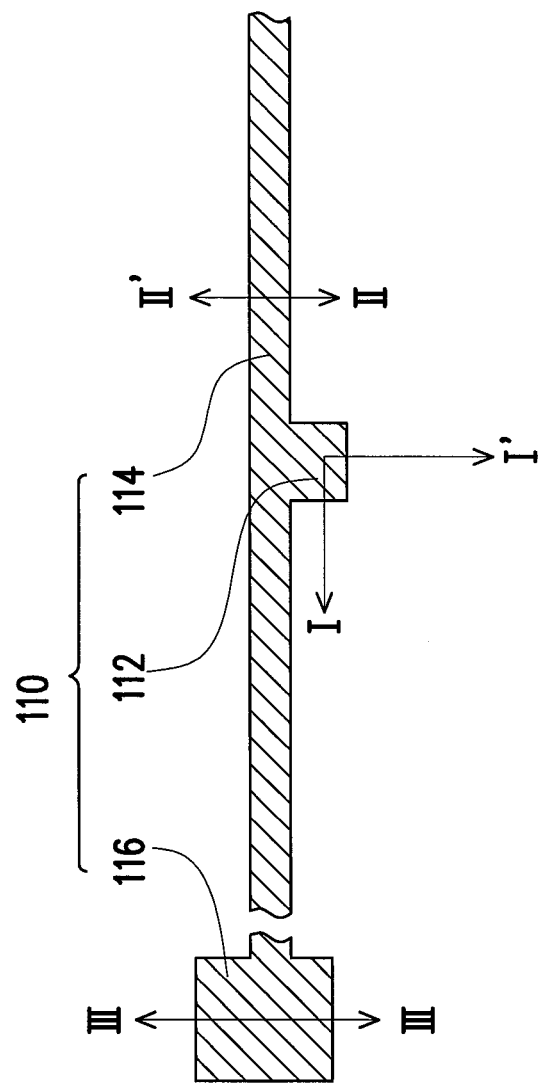
Figure 2B:
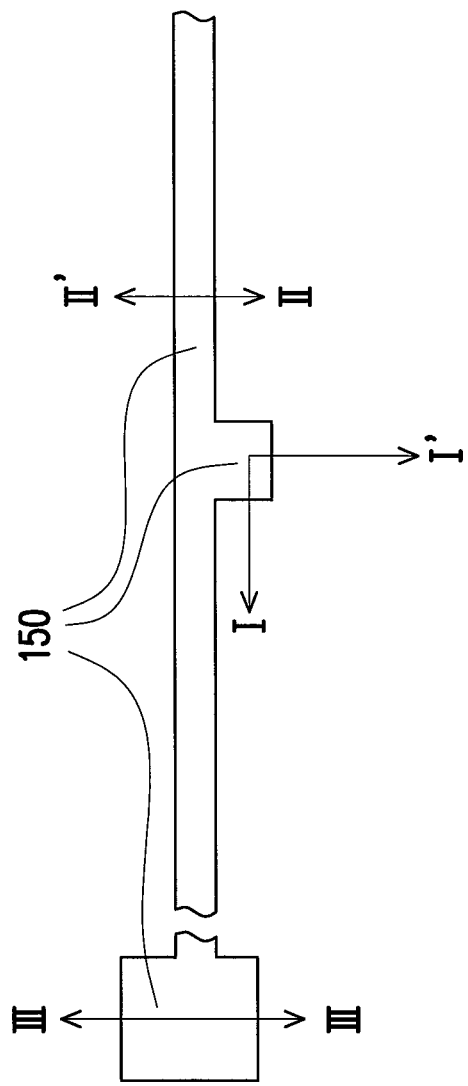

Referring to FIG. 1B and FIG. 2B, a gate insulating layer 120 is formed on the substrate 102 to cover the first patterned conductor layer 110. A material of the gate insulating layer 120 is, for example, a dielectric material such as silicon dioxide, silicon nitride or silicon nitride oxide, etc., and a formation method thereof is, for example, a chemical vapor deposition method.

Then, a metal oxide material layer 130 and an etching stop material layer 140 are sequentially formed on the gate insulating layer 120. In the present embodiment, a material of the metal oxide material layer 130 can be indium gallium zinc oxide (IGZO), zinc oxide (ZnO), tin oxide (SnO) or tin dioxide ($SnO_2$), etc., and a formation method thereof is, for example, a deposition process. A material of the etching stop material layer 140 can be silicon oxide, silicon nitride, etc., and a formation method thereof is, for example, a deposition process.

Then, a photoresist layer (not shown) is formed on the etching stop material layer 140, and the first patterned conductor layer 110 is used as a mask, and a patterned photoresist layer 150 is formed on the etching stop material layer 140 through a back exposure process BLE. Namely, the patterned photoresist layer 150 is formed above the first patterned conductor layer 110, and has a same pattern with that of the first patterned conductor layer 110. In the present embodiment, the patterned photoresist layer 150, for example, includes patterns the same to that of the gate 112, the scan line 114 and the first conductor pattern 116.

Figure 1C:
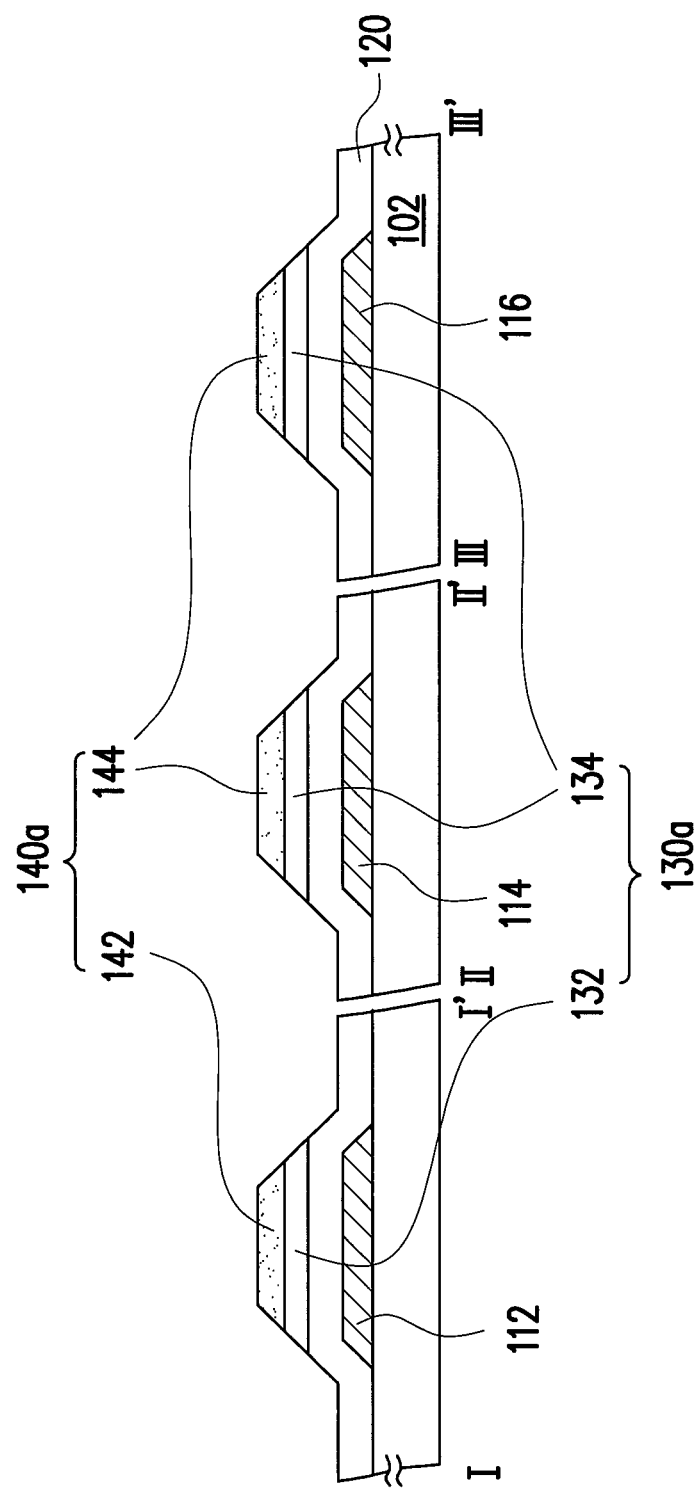
Figure 2C:
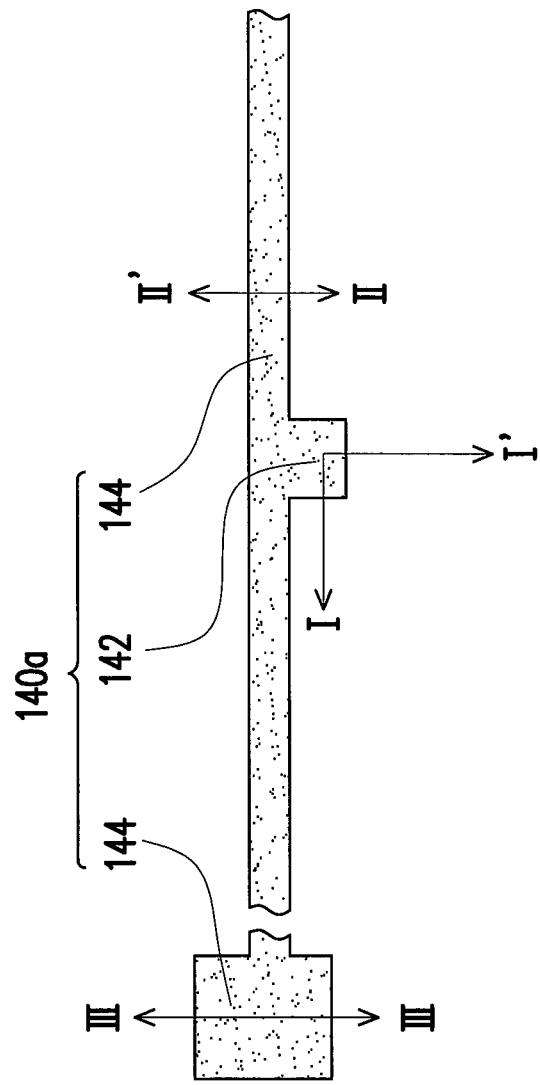

Referring to FIG. 1C and FIG. 2C, the patterned photoresist layer 150 is used as a mask to remove a part of the metal oxide material layer 130 and a part of the etching stop material layer 140, so as to form a metal oxide channel layer 132 and an etching stop layer 142 above the gate 112, and form a metal oxide pattern 134 and an etching stop pattern 144 above the scan line 114 and the first conductor pattern 116. In other words, a patterned metal oxide material layer 130a and a patterned etching stop material layer 140a have the same pattern with that of the first patterned conductor layer 110, where the patterned metal oxide material layer 130a includes the metal oxide channel layer 132 and the metal oxide pattern 134, and the patterned etching stop material layer 140a includes the etching stop layer 142 and the etching stop pattern 144. Therefore, in such step, fabrication of the metal oxide channel layer 132 and the etching stop layer 142 is completed. In the present embodiment, a method for removing a part of the etching stop material layer 140 includes, for example, a dry etching process, and a bottom angle of the formed etching stop layer 142 is, for example, 50°-70°, which is preferably 60°. A method for removing a part of the metal oxide material layer 130 includes, for example, a wet etching process, and a bottom angle of the formed metal oxide channel layer 132 is, for example, 15°-35°, which is preferably 25°.

Figure 1D:
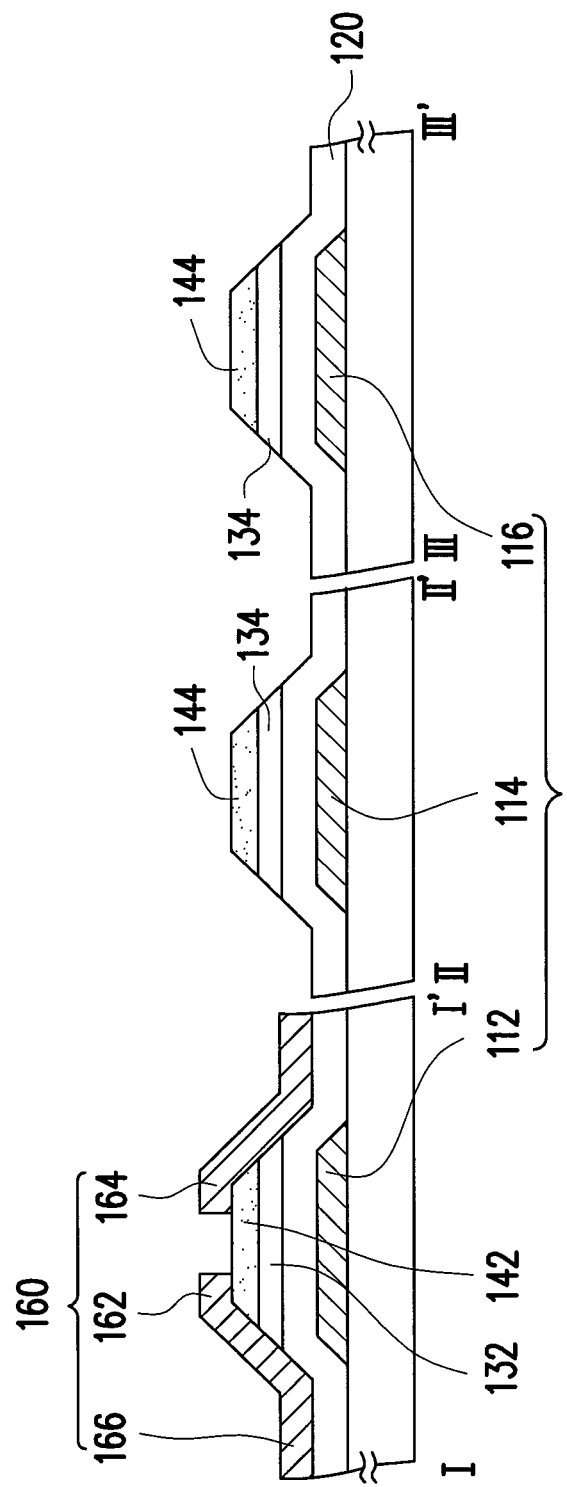
Figure 2D:
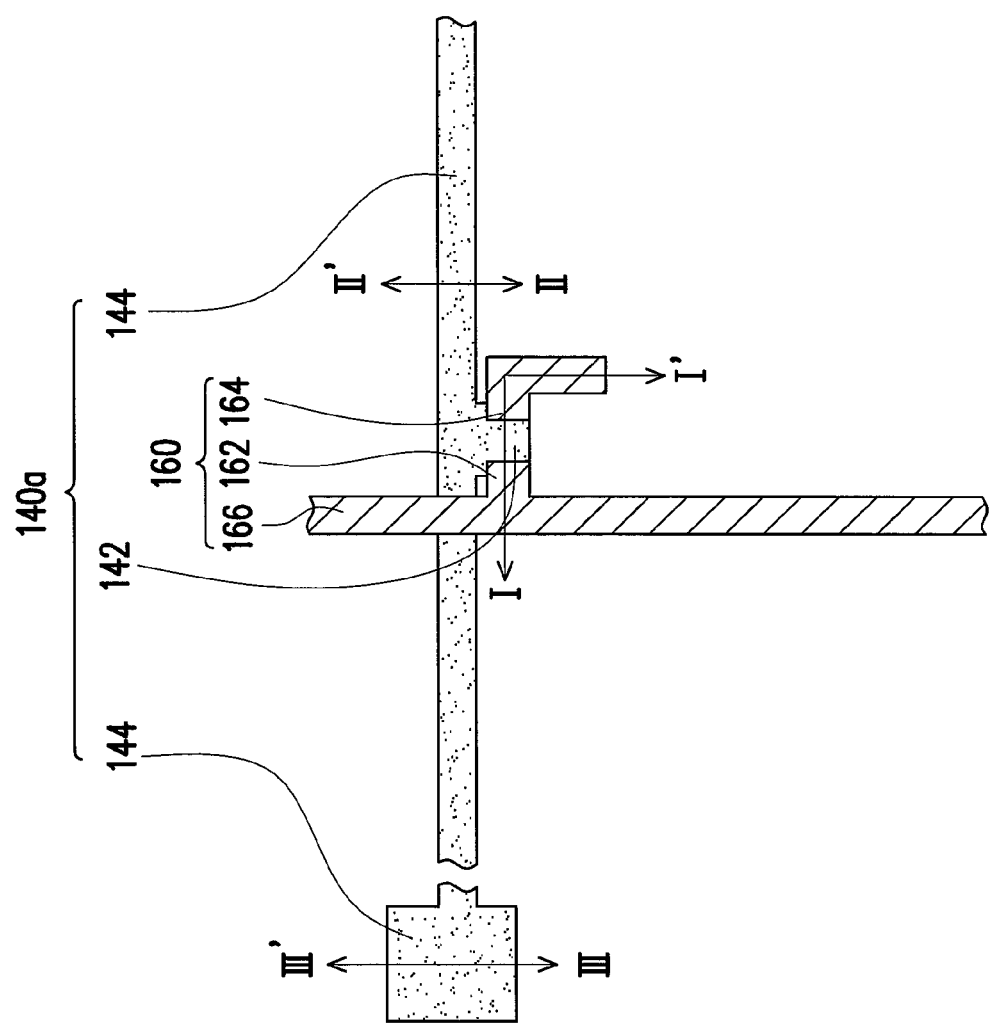

Referring to FIG. 1D and FIG. 2D, a second patterned conductor layer 160 is formed on the substrate 102, and the second patterned conductor layer 160 includes a source 162, a drain 164, and a data line 166 connected to the source 162, and the source 162 and the drain 164 are located at two sides of the etching stop layer 142 above the gate 112. In the present embodiment, a material of the second patterned conductor layer 160 is, for example, aluminium, chromium, tantalum or other metal material, and a formation method thereof includes a thin film deposition process, a photolithography process, and an etching process, etc. In other words, the second patterned conductor layer 160 can be formed through a second mask.

Figure 1E:
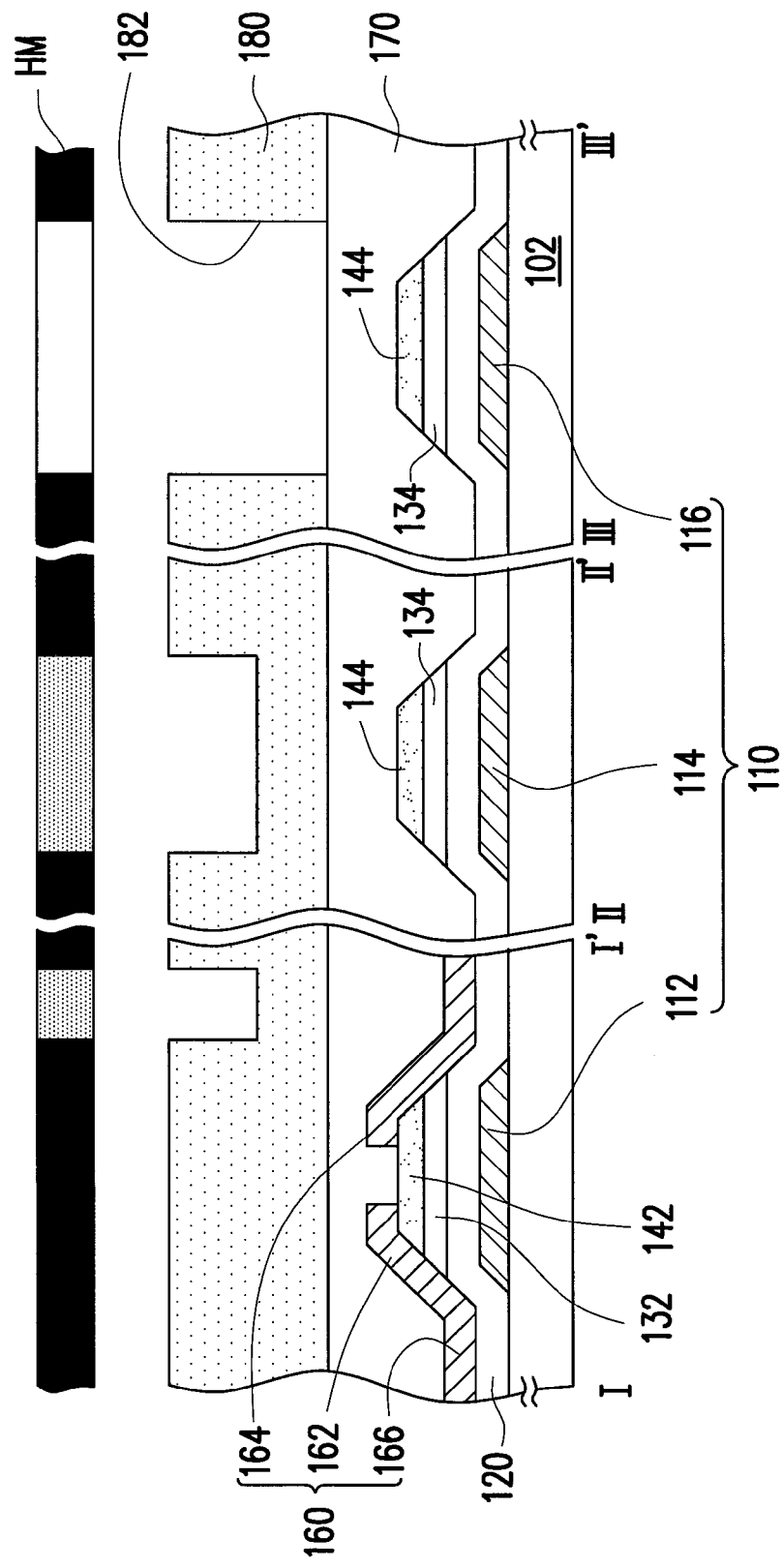
Figure 1F:
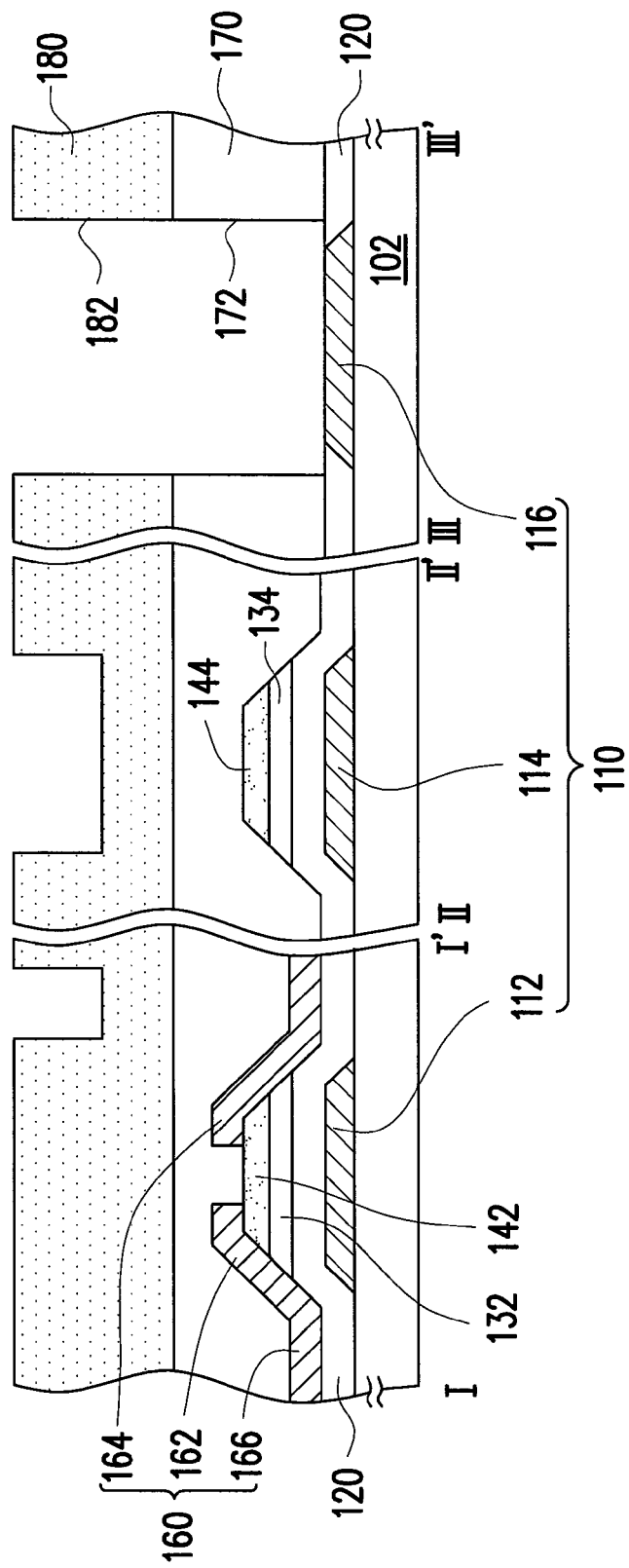
Figure 1G:
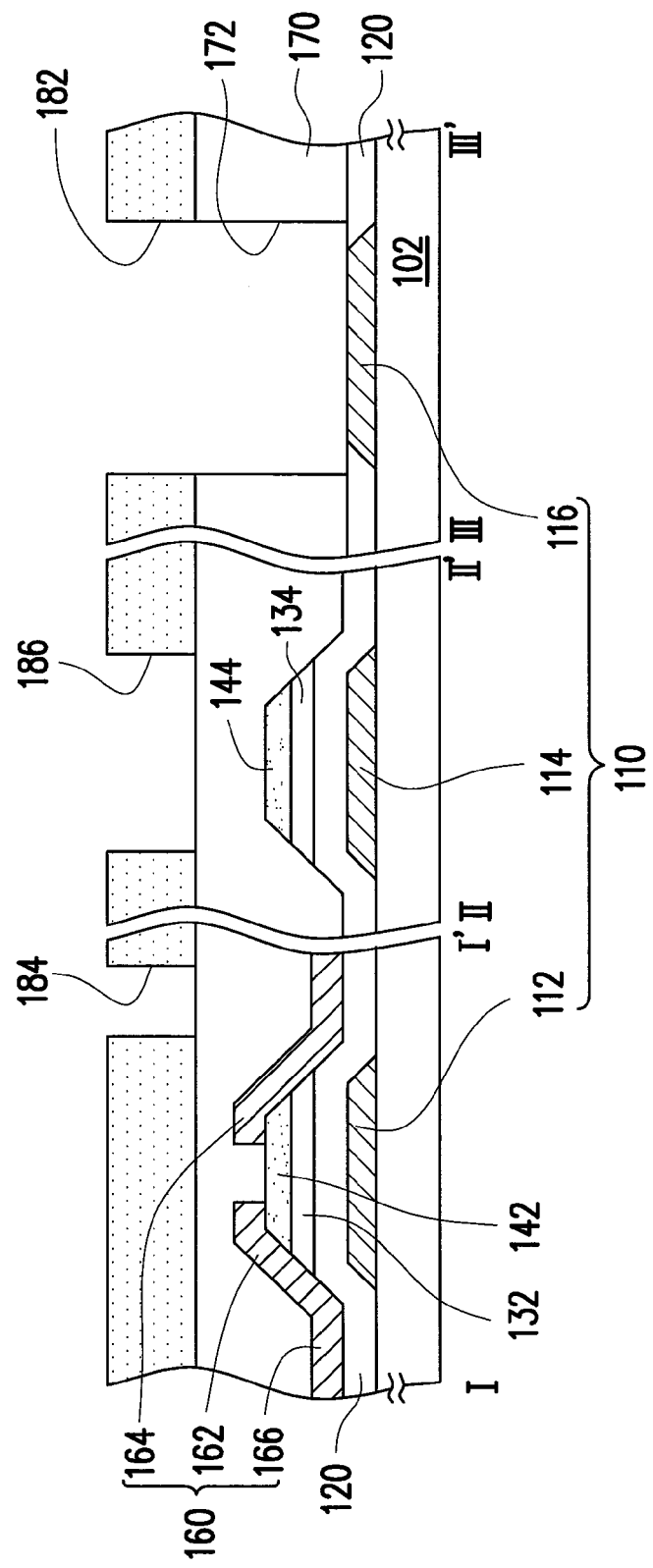
Figure 1H:
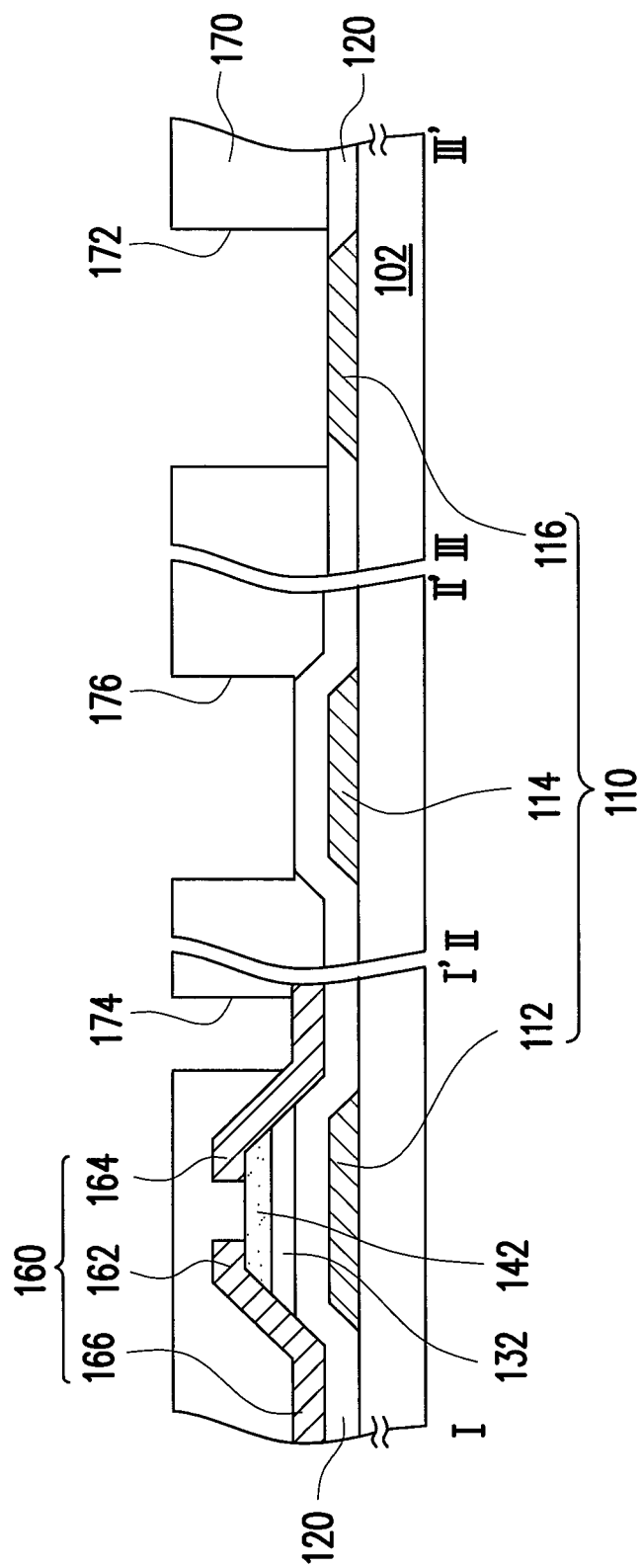
Figure 11:
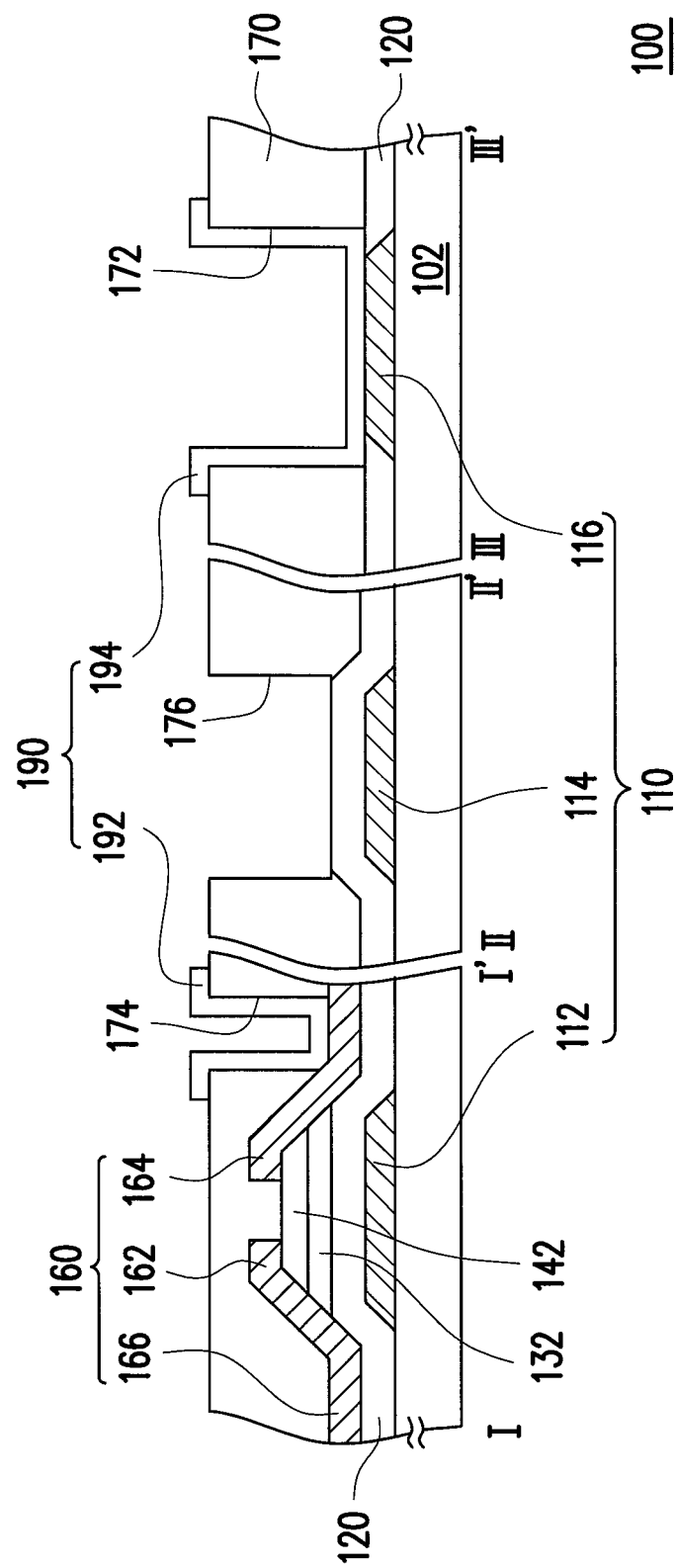
Figure 2E:
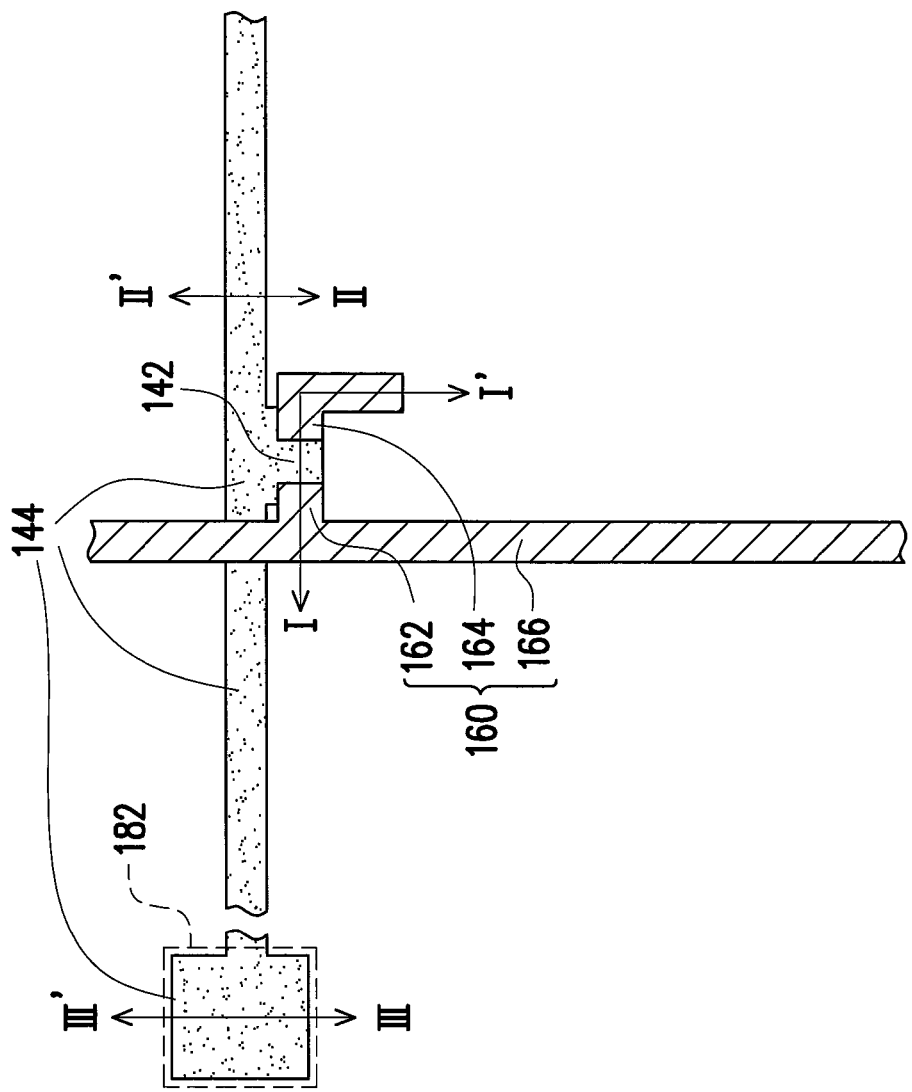

Referring to FIG. 1E to FIG. 1I and FIG. 2E to FIG. 2I, for clarity's sake, the photosensitive layer and the passivation layer are not illustrated in FIG. 2E to FIG. 2I, though dot lines are used to represent openings in the photosensitive layer and the passivation layer. Referring to FIG. 1E and FIG. 2E, a passivation layer 170 is formed on the substrate 102 to cover the second patterned conductor layer 160. In the present embodiment, a material of the passivation layer 170 is, for example, silicon nitride, and a formation method thereof is, for example, a plasma chemical vapor deposition method.

Then, a halftone mask HM is used to form a photosensitive layer 180 having a first opening 182 on the passivation layer 170, where a thickness of the photosensitive layer 180 located above the gate 112 is greater than a thickness of the photosensitive layer 180 located above the drain 164 and the scan line 114, and the first opening 182 exposes the passivation layer 170 located above the first conductor pattern 116. In the present embodiment, the halftone mask HM used for defining the passivation layer 170 is, for example, a third mask. A light transmittance of the halftone mask HM above the gate 112 is, for example, 0% (represented by a black color), a light transmittance of the halftone mask HM above the drain 164 and the scan line 114 is, for example, 50% (represented by a gray color), and a light transmittance of the halftone mask HM above the first conductor pattern 116 is, for example, 100% (represented by a white color). In such step, a photosensitive material layer (not shown) is first formed on the passivation layer 170, and then the photosensitive material layer is exposed by using the halftone mask HM, so as to form the photosensitive layer 180 shown in FIG. 1E.

Referring to FIG. 1F and FIG. 2F to FIG. 1H and FIG. 2H, the photosensitive layer 180 is used as a mask to remove a part of the passivation layer 170, the etching stop pattern 144 and the metal oxide pattern 134 to from a first contact opening 172, a second contact opening 174 and a third contact opening 176 in the passivation layer 170, where the first contact opening 172 exposes the first conductor pattern 116, the second contact opening 174 exposes the drain 164, and the third contact opening 176 exposes the gate insulating layer 120 on the scan line 114.

Figure 2F:
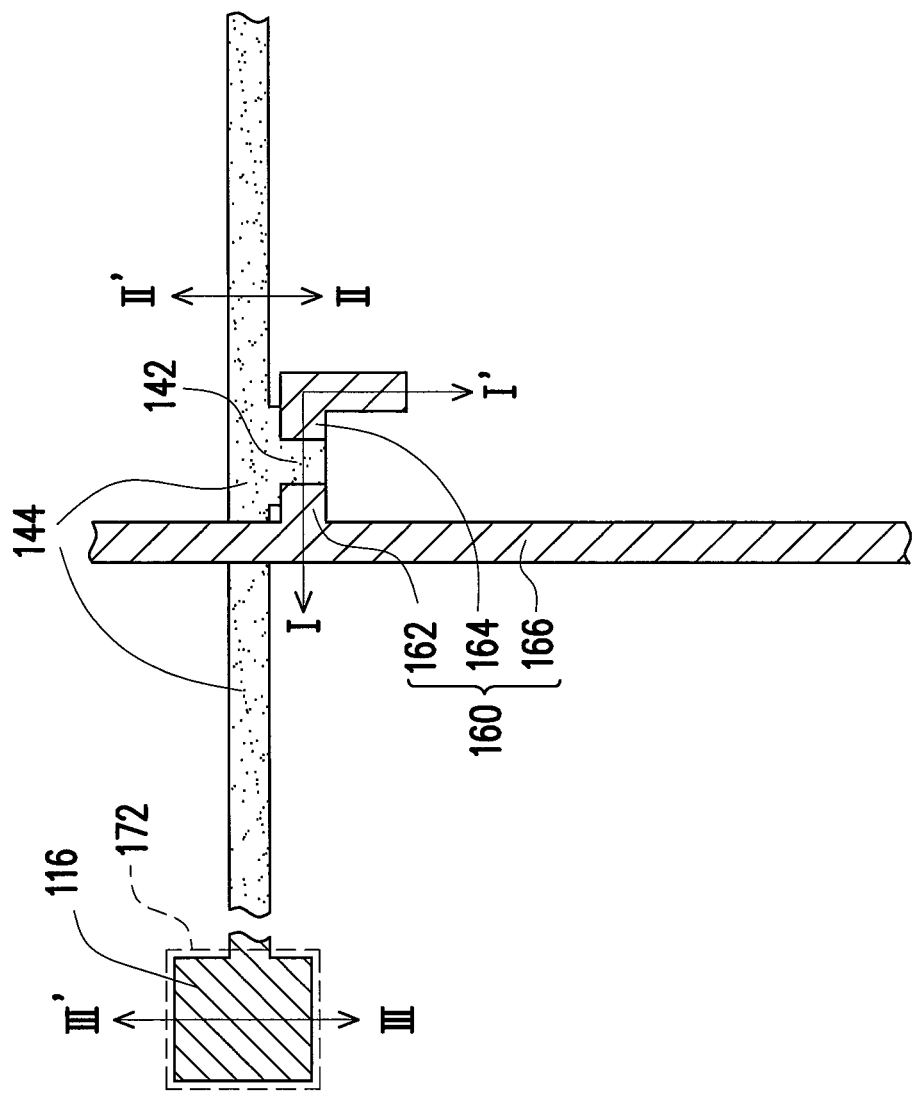

In the present embodiment, a method of forming the first contact opening 172, the second contact opening 174 and the third contact opening 176 includes following steps. First, as shown in FIG. 1F and FIG. 2F, by using the photosensitive layer 180 having the first opening 182 as a mask, a part of the passivation layer 170 above the first conductor pattern 116, a part of the etching stop pattern 144 and a part of the metal oxide pattern 134 are removed, so as to form the first contact opening 172 exposing the first conductor pattern 116 in the passivation layer 170. In the present embodiment, a method of removing a part of the passivation layer 170, a part of the etching stop pattern 144 and a part of the metal oxide pattern 134 is, for example, a dry etching process.

Figure 2G:
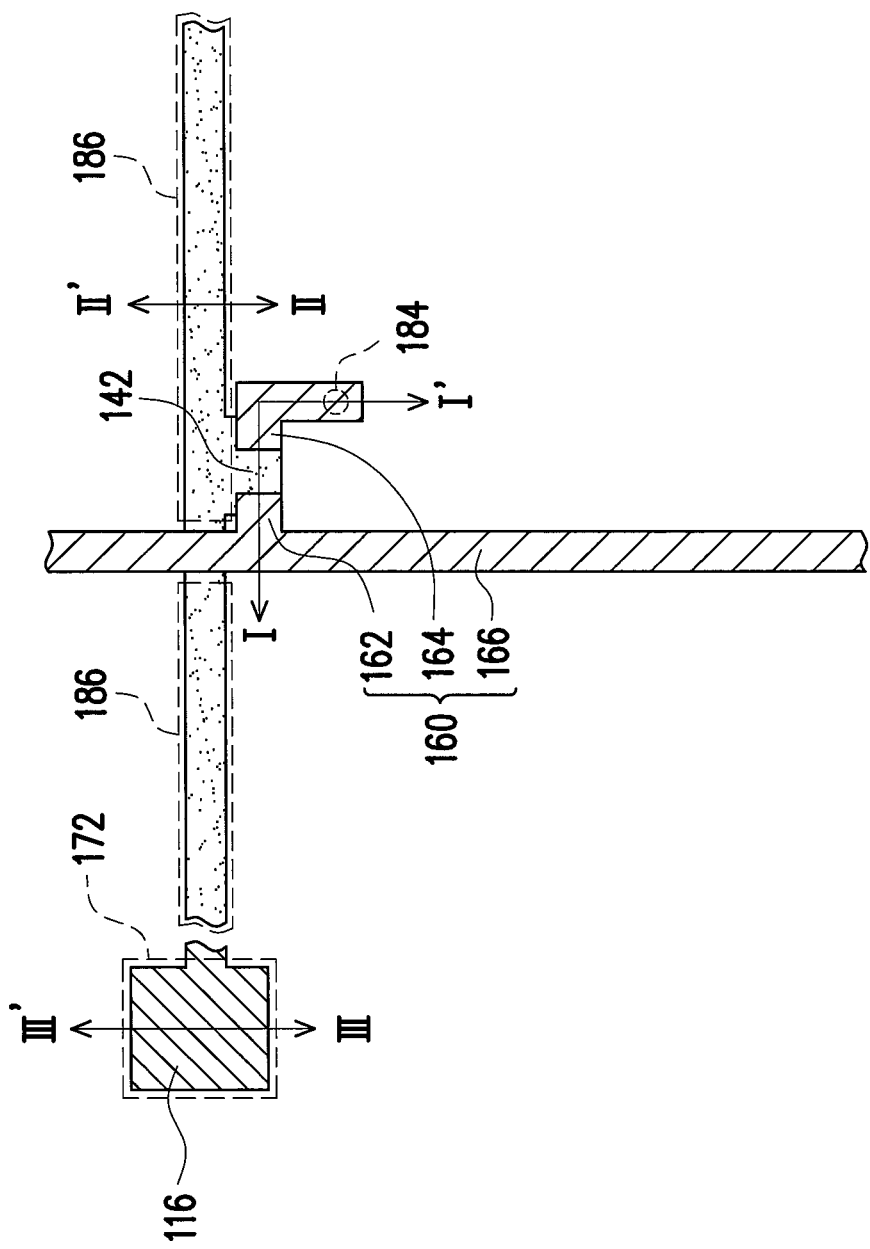
Figure 2H:
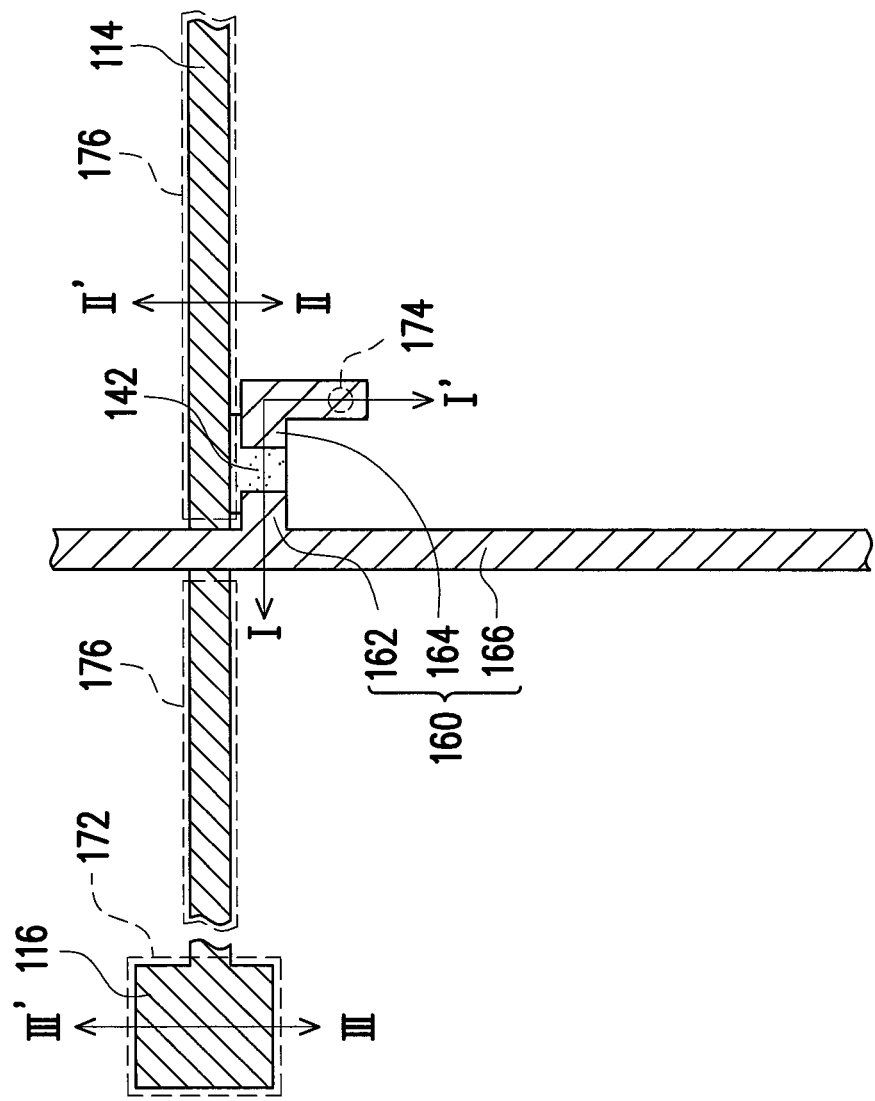
Figure 21:
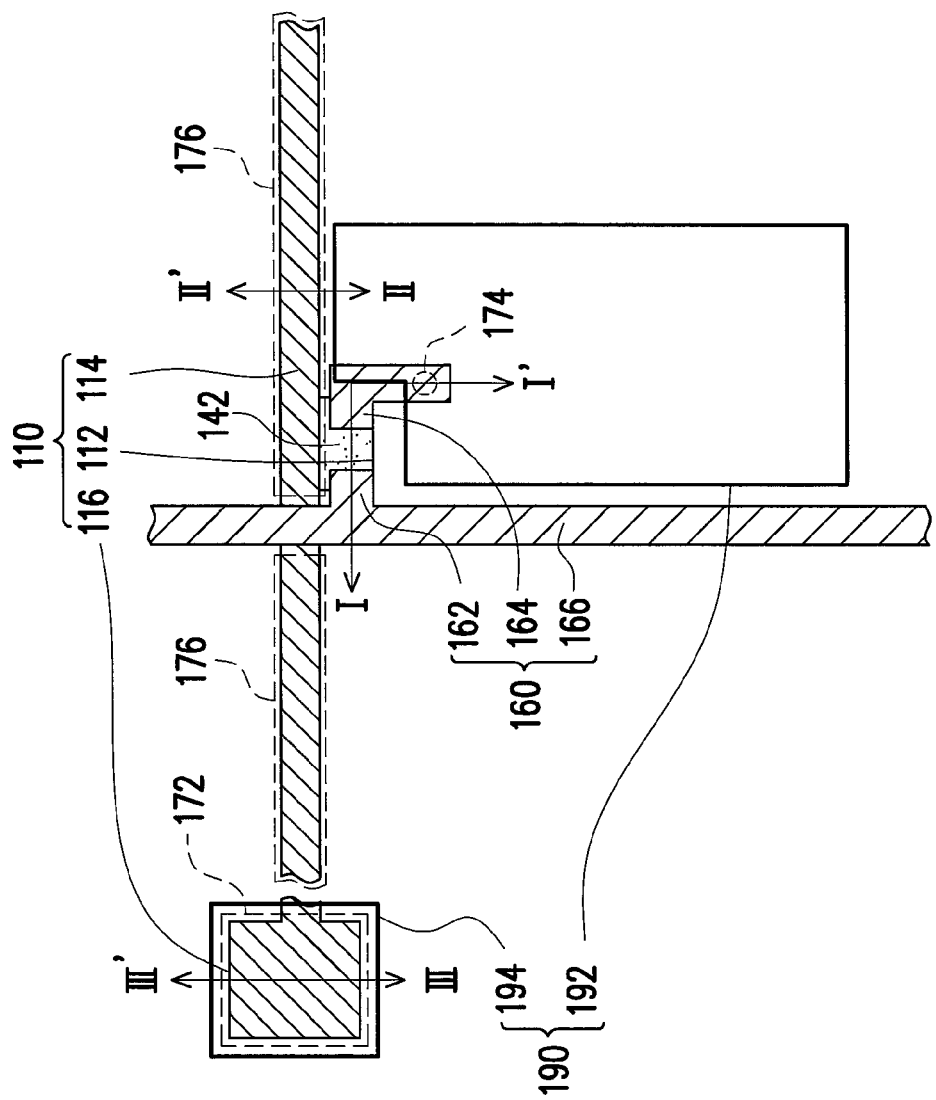

Then, as shown in FIG. 1G and FIG. 2G, the photosensitive layer 180 with a thinner thickness above the drain 164 and the scan line 114 is removed to form a second opening 184 and a third opening 186 in the photosensitive layer 180, and the remained photosensitive layer 180 is located above the gate 112, where the second opening 184 and the third opening 186 respectively expose the passivation layer 170 above the drain 164 and the scan line 114. In the present embodiment, the method of removing a part of the photosensitive layer 180 is, for example, an oxygen (plasma) ashing process.

Then, referring to FIG. 1G and FIG. 2G and FIG. 1H and FIG. 2H, the photosensitive layer 180 having the second opening 184 and the third opening 186 is used as a mask to remove a part of the passivation layer 170, the remained etching stop pattern 144 and the remained metal oxide pattern 134 to form the second contact opening 174 and the third contact opening 176 in the passivation layer 170, where the second contact opening 174 exposes the drain 164, and the third contact opening 176 exposes the gate insulating layer 120 above the scan line 114. In detail, in such step, the passivation layer 170 and the remained etching stop pattern 144 are removed through the second opening 184 and the third opening 186 by a first etching process.

Then, the remained metal oxide pattern 134 is removed through the third opening 186 by a second etching process. The first etching process can be a dry etching process, and the second etching process can be the dry etching process or a wet etching process. It should be noticed that to facilitate simultaneously removing the passivation layer 170 and the etching stop pattern 144 above the scan line 114, the etching stop material layer 140 and the passivation layer 170 having the same or similar materials can be adopted, though the invention is not limited thereto.

Then, the remained photosensitive layer 180 is removed. A method of removing the photosensitive layer 180 is, for example, a stripping method.

Referring to FIG. 1I and FIG. 2I, a patterned transparent conductive layer 190 is formed on the passivation layer 170, where the patterned transparent conductive layer 190 includes a pixel electrode 192, and the pixel electrode 192 is electrically connected to the drain 164 through the second contact opening 174. In the present embodiment, the patterned transparent conductive layer 190 further includes a transparent conductive pattern 194, and the transparent conductive pattern 194 is electrically connected to the first conductor pattern 116 through the first contact opening 172. A material of the patterned transparent conductive layer 190 is, for example, indium tin oxide (ITO), pr indium zinc oxide (IZO), etc. Moreover, the patterned transparent conductive layer 190 is, for example, formed through a fourth mask process. Therefore, in the present embodiment, the pixel structure 100 is manufactured through four mask processes.

In summary, in the method for manufacturing the pixel structure, the first patterned conductor layer is used as the mask when performing the back exposure on the photoresist layer, so as to from a metal oxide channel layer and an etching stop layer on the gate through the photoresist layer. Then, the photoresist layer used for defining the passivation layer is formed by using a halftone mask, so as to form a plurality of contact openings in the passivation layer and remove the metal oxide pattern and the etching stop pattern other than that above the gate. In other words, by using the back exposure process in collaboration with the halftone mask, two masks used for defining the metal oxide channel layer and the etching stop layer are saved, and four mask processes can be used to implement manufacturing the pixel structure. In this way, manufacturing cost of the pixel structure is decreased to improve productivity of the pixel structure. Moreover, although the number of the masks is decreased, the etching stop layer can be still formed on the metal oxide channel layer, which avails decreasing a delay effect of resistance and capacitance, so as to avoid exposing the metal oxide channel layer in plasma, etching liquid and photoresist stripping liquid. In this way, the thin film transistor pixel structure that uses metal oxide such as IGZO, etc. as the channel layer may have better performance. Therefore, a liquid crystal display using the thin film transistor as a driving device may have advantages of good display quality and stable electrical property.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for manufacturing a pixel structure, comprising:
    forming a first patterned conductor layer on a substrate, wherein the first patterned conductor layer comprises a gate, a scan line connected to the gate and a first conductor pattern;
    forming a gate insulating layer on the substrate to cover the first patterned conductor layer;
    sequentially forming a metal oxide material layer and an etching stop material layer on the gate insulating layer;
    using the first patterned conductor layer as a photomask to form a patterned photoresist layer on the etching stop material layer through a back exposure process;
    using the patterned photoresist layer as a mask to remove a part of the metal oxide material layer and a part of the etching stop material layer, so as to form a metal oxide channel layer and an etching stop layer above the gate, and form a metal oxide pattern and an etching stop pattern above the scan line and the first conductor pattern;
    forming a second patterned conductor layer on the substrate, wherein the second patterned conductor layer comprises a source, a drain and a data line connected to the source, and the source and the drain are located at two sides on the etching stop layer located above the gate;
    forming a passivation layer on the substrate to cover the second patterned conductor layer;
    using a halftone mask to form a photosensitive layer having a first opening on the passivation layer, wherein a thickness of the photosensitive layer located above the gate is greater than a thickness of the photosensitive layer located above the drain and the scan line, and the first opening exposes the passivation layer located above the first conductor pattern;
    using the photosensitive layer as a mask to remove a part of the passivation layer, the etching stop pattern and the metal oxide pattern to form a first contact opening, a second contact opening and a third contact opening in the passivation layer, wherein the first contact opening exposes the first conductor pattern, the second contact opening exposes the drain, and the third contact opening exposes the gate insulating layer on the scan line;
    removing the photosensitive layer; and
    forming a patterned transparent conductive layer on the passivation layer, wherein the patterned transparent conductive layer comprises a pixel electrode, and the pixel electrode is electrically connected to the drain through the second contact opening.

2. The method for manufacturing the pixel structure as claimed in claim 1, wherein the step of removing a part of the passivation layer, the etching stop pattern and the metal oxide pattern comprises:
    using the photosensitive layer having the first opening as a mask to remove a part of the passivation layer, a part of the etching stop pattern and a part of the metal oxide pattern above the first conductor pattern to form the first contact opening exposing the first conductor pattern in the passivation layer;
    removing the photosensitive layer with a thinner thickness on the drain and the scan line to form a second opening and a third opening in the photosensitive layer, wherein the remained photosensitive layer is located above the gate, and the second opening and the third opening respectively expose the passivation layer above the drain and the scan line; and
    using the photosensitive layer having the second opening and the third opening as a mask to remove a part of the passivation layer, the remained etching stop pattern and the remained metal oxide pattern to form the second contact opening and the third contact opening in the passivation layer.

3. The method for manufacturing the pixel structure as claimed in claim 2, wherein the step of removing a part of the passivation layer through the second opening and the third opening comprises:
    removing the passivation layer and the remained etching stop pattern through the second opening and the third opening by a first etching process; and
    removing the remained metal oxide pattern through the third opening by a second etching process.

4. The method for manufacturing the pixel structure as claimed in claim 1, wherein the patterned transparent conductive layer further comprises a transparent conductive pattern, and the transparent conductive pattern is electrically connected to the first conductive pattern through the first contact opening.

5. The method for manufacturing the pixel structure as claimed in claim 1, wherein a material of the metal oxide material layer comprises indium gallium zinc oxide.

6. The method for manufacturing the pixel structure as claimed in claim 1, wherein a material of the etching stop material layer comprises silicon oxide or silicon nitride.

7. The method for manufacturing the pixel structure as claimed in claim 1, wherein a material of the etching stop material layer is the same to a material of the passivation layer.

8. The method for manufacturing the pixel structure as claimed in claim 1, wherein a method for removing a part of the etching stop material layer comprises a dry etching process.

9. The method for manufacturing the pixel structure as claimed in claim 1, wherein a method for removing a part of the metal oxide material layer comprises a wet etching process.

* * * * *